US010147719B2

(12) United States Patent
Wang et al.

(10) Patent No.: US 10,147,719 B2
(45) Date of Patent: Dec. 4, 2018

(54) SEMICONDUCTOR FIELD EFFECT TRANSISTORS AND MANUFACTURING METHOD THEREOF

(71) Applicant: Taiwan Semiconductor Manufacturing Co., Ltd., Hsinchu (TW)

(72) Inventors: Chin-Shan Wang, Hsinchu (TW); Shun-Yi Lee, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 45 days.

(21) Appl. No.: 15/355,031

(22) Filed: Nov. 17, 2016

(65) Prior Publication Data

US 2018/0138168 A1    May 17, 2018

(51) Int. Cl.
*H01L 21/8234* (2006.01)
*H01L 29/08* (2006.01)
*H01L 27/06* (2006.01)
*H01L 29/66* (2006.01)
*H01L 21/8238* (2006.01)

(52) U.S. Cl.
CPC .. *H01L 27/0629* (2013.01); *H01L 21/823418* (2013.01); *H01L 21/823468* (2013.01); *H01L 21/823475* (2013.01); *H01L 21/823814* (2013.01); *H01L 21/823871* (2013.01); *H01L 29/0847* (2013.01); *H01L 29/66545* (2013.01)

(58) Field of Classification Search
CPC .. H01L 27/0928; H01L 27/085–27/092; H01L 27/0924; H01L 21/027; H01L 21/0273; H01L 21/0332; H01L 21/311–21/31122; H01L 21/44–21/441; H01L 21/823814
See application file for complete search history.

(56) References Cited

U.S. PATENT DOCUMENTS 5,126,280 A * 6/1992 Chan ................ H01L 27/10817
257/309
5,292,677 A * 3/1994 Dennison .......... H01L 27/10817
257/296

(Continued)

*Primary Examiner* — Maliheh Malek
(74) *Attorney, Agent, or Firm* — JCIPRNET

(57) ABSTRACT

A semiconductor device includes a substrate, source/drain contacts, gate structures, conductive elements, and a first stop layer. The substrate has source/drain regions formed therein. The source/drain contacts are over the substrate and each of the source/drain contacts is electrically connected to the respective source/drain region. The gate structures are arranged in parallel on the substrate. The source/drain regions are arranged at opposite sides of the gate structures. Each of the gate structures is sandwiched between two most adjacent source/drain contacts. The conductive element is on the source/drain contacts and crosses over the gate structures. The conductive element is overlapped with at least one gate structure and at least two most adjacent source/drain contacts and is electrically connected to the at least two most adjacent source/drain contacts. The first stop layer is located between the gate structures and the conductive elements to electrically insulate the gate structures from the conductive elements.

16 Claims, 6 Drawing Sheets

(56) References Cited

U.S. PATENT DOCUMENTS

| | | | | |
|---|---|---|---|---|
| 5,872,373 | A * | 2/1999 | Itoh | H01L 28/91 257/295 |
| 6,040,595 | A * | 3/2000 | Yang | H01L 27/1085 257/300 |
| 6,329,251 | B1 * | 12/2001 | Wu | H01L 21/76897 257/E21.507 |
| 6,392,264 | B2 * | 5/2002 | Takeuchi | H01L 28/91 257/295 |
| 6,518,130 | B1 * | 2/2003 | Ohno | H01L 21/823814 257/E21.634 |
| 9,536,835 | B2 * | 1/2017 | Song | H01L 27/088 |
| 2004/0038466 | A1 * | 2/2004 | Yen | H01L 21/28194 438/197 |
| 2007/0087458 | A1 * | 4/2007 | Tanaka | H01L 21/268 438/22 |
| 2011/0303922 | A1 * | 12/2011 | Cho | H01L 27/1288 257/71 |
| 2013/0020623 | A1 * | 1/2013 | Tsui | H01L 27/11519 257/300 |
| 2013/0285155 | A1 * | 10/2013 | Glass | H01L 29/0847 257/369 |
| 2015/0008513 | A1 * | 1/2015 | Lin | H01L 29/4236 257/330 |
| 2015/0104913 | A1 * | 4/2015 | Liu | H01L 21/823821 438/229 |
| 2016/0049480 | A1 * | 2/2016 | Chang | H01L 29/41741 257/369 |
| 2016/0111418 | A1 * | 4/2016 | Wang | H01L 23/5223 257/296 |
| 2016/0187693 | A1 * | 6/2016 | Woo | G02F 1/13338 257/72 |
| 2016/0268434 | A1 * | 9/2016 | Ching | H01L 29/7851 |
| 2017/0077034 | A1 * | 3/2017 | Song | H01L 27/088 |
| 2017/0125586 | A1 * | 5/2017 | Lee | H01L 29/6653 |
| 2017/0256624 | A1 * | 9/2017 | Lee | H01L 29/47 |
| 2018/0012913 | A1 * | 1/2018 | Lee | H01L 27/1225 |
| 2018/0061715 | A1 * | 3/2018 | Kuo | H01L 21/76829 |
| 2018/0076319 | A1 * | 3/2018 | Mallikarjunaswamy | H01L 21/82385 |
| 2018/0090492 | A1 * | 3/2018 | Ranjan | H01L 27/0886 |

* cited by examiner

SEMICONDUCTOR FIELD EFFECT TRANSISTORS AND MANUFACTURING METHOD THEREOF

BACKGROUND

The semiconductor integrated circuit (IC) industry has experienced rapid growth. Over the course of this growth, functional density of the devices has generally increased by the device feature size. Capacitors are key components commonly used in semiconductor integrated circuits. The capacitance of capacitors may be influenced when the areas of the capacitors are decreased. The scaling down process generally provides benefits by increasing production efficiency, lower costs, and/or improving performance. Such scaling down has also increased the complexities of processing and manufacturing ICs. For these advances to be realized, developments in IC (for example, capacitor) fabrication are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
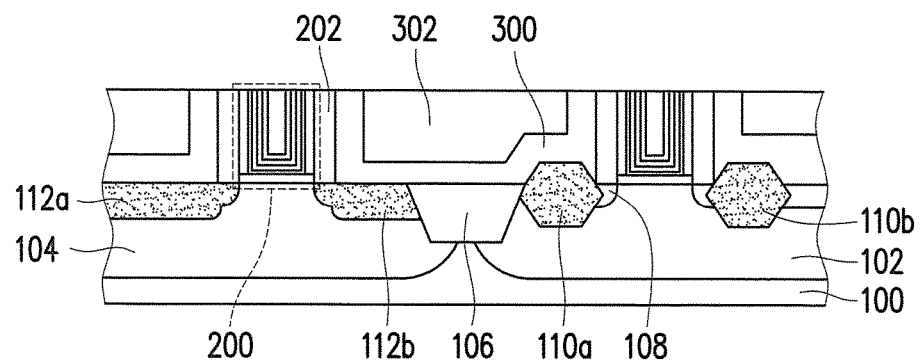
FIGS. 1A-1G are perspective views of a method of manufacturing a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-1G are perspective views of a method of manufacturing a semiconductor device in accordance with some embodiments of the disclosure. For simplicity in explanation, the process flow illustrated in FIGS. 1A-1G are directed to planar MOS (metal-oxide-semiconductor) transistors. However, the disclosure is not limited thereto. In some alternative embodiments, the following method may be modified to be suitable in a FinFET (Fin Field-Effect Transistor). Referring to FIG. 1A, a substrate 100 is provided. An exemplary material of the substrate 100 includes silicon, an alloy semiconductor such as silicon germanium, silicon germanium carbide, gallium arsenic phosphide, or gallium indium phosphide, or other semiconductor materials. In addition, the substrate 100 may be a semiconductor on insulator, such as silicon on insulator (SOI) or silicon on sapphire. Alternatively or additionally, the substrate 100 includes other elementary semiconductor materials such as germanium, gallium arsenic, or other suitable semiconductor materials. In some embodiments, the substrate 100 further includes other features such as various doped regions, a buried layer, and/or an epitaxy layer. For instances, the substrate 100 includes a first well region 102 and a second well region 104. The first well regions 102 and the second well regions 104 may be formed in a P-well structure, in an N-well structure, or in a dual-well structure. In some embodiments, the first well region 102 may be an n-type well region and the second well region 104 may be a p-type well region 104. However, in some alternative embodiments, the types of the well may be interchanged. The first well region 102 and the second well region 104 are formed through doping the substrate 100 with a specific dopant. For example, the first well region 102 may be formed by doping the substrate 100 with n-type dopants and the second well region 104 may be formed by doping the substrate 100 with p-type dopants. The n-type dopants include, for example, boron or $BF_2$. On the other hand, the p-type dopants may include phosphorous or arsenic.

Moreover, the substrate 100 also includes isolation region 106, which are formed to isolate the transistor formed subsequently. The isolation region 106 utilizes isolation technology, such as local oxidation of silicon (LOCOS) or shallow trench isolation (STI) to electrically isolate various regions. If the isolation regions are made of STIs, the STI region comprises silicon oxide, silicon nitride, silicon oxynitride, other suitable materials, or a combination thereof. In some embodiments, the filled trench has a multi-layer structure such as a thermal oxide liner layer filled with silicon nitride or silicon oxide.

In some embodiments, a plurality of gate structures 200 are formed over the first well region 102 and the second well region 104 of the substrate 100. In certain embodiments, the gate structures 200 may be replacement metal gate structures formed by a gate replacement process. In detail, a plurality of dummy gate structures (not illustrated) made of polysilicon may be formed over the substrate 100 first. After other elements illustrated in FIG. 1A are formed, the dummy gate structures are replaced by metallic gate structures 200. The dummy gate structures may be removed through an etching process or other suitable processes. On the other hand, the gate structures 200 are formed by depositing a metal material through suitable processes such as atomic layer deposition (ALD), chemical vapor deposition (CVD), physical vapor deposition (PVD), plating, or a combination thereof.

In some embodiments, one of the gate structure 200 includes TiN, WN, TaN, or Ru for a PMOS device, and the other one of the gate structure 200 includes Ti, Ag, Al, TiAl, TiAlN, TaC, TaCN, TaSiN, Mn, or Zr for an NMOS device. The gate structure 200 includes a gate dielectric layer disposed between the metallic gate and the substrate 100. The gate dielectric layer includes silicon oxide, silicon nitride, silicon oxy-nitride, high-k dielectric materials, or a combination thereof. It should be noted that the high-k dielectric materials are generally dielectric materials having a dielectric constant greater than 4. High-k dielectric materials include metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or a combination thereof. As illustrated in FIG. 1A, the gate structure 200 may be a multi-layered structure. In other words, in some embodiments, the gate structure 200 may further include a barrier, a work function layer, or a combination thereof. Optionally, a liner layer, an interfacial layer, a seed layer, an adhesion layer or a combination thereof may be further included between the gate structure 200 and the substrate 100.

In some embodiments, a plurality of spacers 202 may be formed on opposite sidewalls of the gate structures 200. The spacers 202 are formed of, for example, silicon oxide, silicon nitride, silicon oxynitride, silicon carbide, fluoride-doped silicate glass (FSG), low-k dielectric materials, or a combination thereof. The low-k dielectric materials are generally dielectric materials having a dielectric constant lower than 3.9. The spacers 202 may be a single layer or have a multi-layer structure which includes multiple liner layers. The liner layer includes a dielectric material such as silicon oxide, silicon nitride, and/or other suitable materials. The formation of the spacers 202 can be achieved by depositing suitable a dielectric material and anisotropically etching back the dielectric material.

A plurality of source/drain regions 110a, 110b, 112a, and 112b is formed in the substrate 100. In some embodiments, the source/drain regions 110a, 110b are formed in the first well region 102 and are located on two opposite sides of the gate structure 200 disposed over the first well region 102. Similarly, the source/drain regions 112a and 112b are formed within the second well region 104 and are located on two opposite sides of the gate structure 200 disposed over the second well region 104. The source/drain regions 110a, 110b, 112a, and 112b may be heavily doped regions. In some embodiments, the source/drain regions 110a, 110b, 112a, and 112b may be formed by one or more ion implantation process. However, other suitable methods may also be utilized to form the source/drain regions 110a, 110b, 112a, and 112b. In some alternative embodiments, the formation of the source/drain regions may include recessing part of the substrate 100 through etching or other suitable processes and filling epitaxial materials in the recessed region through epitaxy growth. Specifically, the epitaxial materials include SiGe, SiC, or other suitable materials. For example, the source/drain regions 110a and 110b may be formed through epitaxy growth while the source/drain regions 112a and 112b may be formed through ion implantation. The dopants for the source/drain regions 110a, 110b, 112a, and 112b may be of opposite conductive type as that of the respective well regions. For instance, if the first well region 102 is an n-type well region, the source/drain regions 110a and 110b may be doped with a p-type dopant. On the other hand, if the second well region 104 is a p-type well region, the source/drain regions 112a and 112b may be doped with an n-type dopant. Based on these dopant types, the source/drain regions 110a, 110b and the gate structure 200 disposed over the first well region 102 form a PMOS transistor. On the other hand, the source/drain regions 112a, 112b and the gate structure 200 disposed over the second well region 104 form an NMOS transistor. As illustrated in FIG. 1A, a plurality of lightly doped regions 108 may be formed in the substrate 100. In some embodiments, each of the lightly doped regions 108 may be lightly doped drain (LDD) and is located between the source/drain regions 110a, 110b and the gate structure 200. It is understood that the semiconductor device structure of the disclosure may be formed by CMOS technology processing, and thus some processes are not described in detail herein.

Referring to FIG. 1A again, in some embodiments, a first stop material layer 300 and an interlayer dielectric layer 302 are formed aside of the gate structures 202. In detail, the first stop material layer 300 is formed to conformally cover the gate structures 200, the spacers 202, the source drain regions 110a, 110b, 112a, 112b, and the isolation regions 106. Subsequently, the interlayer dielectric layer 302 is formed over the first stop material layer 300. Thereafter, a portion of the first stop material layer 300 and a portion of the interlayer dielectric layer 302 are removed and a top surface of each of the gate structures 200 is exposed, thus obtaining the structure illustrated in FIG. 1A. The process of removing portions of the first stop material layer 300 and portions of the interlayer dielectric layer 302 may be achieved by performing a chemical mechanical polishing (CMP) process, an etching process, or other suitable process. As illustrated in FIG. 1A, after the removing process, each of the spacers 202 and the first stop material layer 300 are located between the interlayer dielectric layer 302 and the gate structures 200.

In some embodiments, the first stop material layer 300 is a contact etch stop layer (CESL). The first stop material layer 300 includes a high-k dielectric material. For example, the first stop material layer 300 may include silicon nitride, carbon-doped silicon nitride, or a combination thereof. In some embodiments, the first stop material layer 300 is deposited using CVD, high density plasma (HDP) CVD, sub-atmospheric CVD (SACVD), molecular layer deposition (MLD), or other suitable methods. In some embodiments, before the first stop material layer 300 is formed, a buffer layer (not shown) may be further formed over the substrate 100. In an embodiment, the buffer layer may be an oxide layer formed of silicon oxide, for example. The interlayer dielectric layer 302 includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the interlayer dielectric layer 302 includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the interlayer dielectric layer 302 may include one or more dielectric materials and/or one or more dielectric layers. In some embodiments, the interlayer dielectric layer 302 is formed to a suitable thickness by Flowable CVD (FCVD), CVD, HDPCVD, SACVD, spin-on, sputtering, or other suitable methods.

Figure 1B:
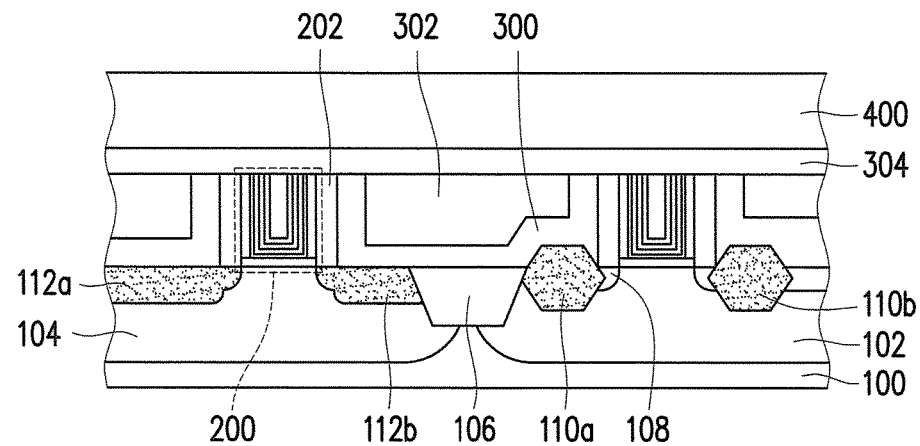

Referring to FIG. 1B, in some embodiments, a second stop material layer 304 and a photoresist layer 400 are sequentially formed over the gate structures 200, the first stop material layer 300, and the interlayer dielectric layer 302. The second stop material layer 304 may include a same material as that of the first stop material layer 300. For example, the second stop material layer 304 includes high-k dielectric material and may be made of silicon nitride. Thus, in some embodiments, the second stop material layer 304 may also be referred as a contact etch stop layer (CESL). Alternatively, the second stop material layer 304 may be formed of a material different from that of the first stop material layer 300.

Figure 1C:
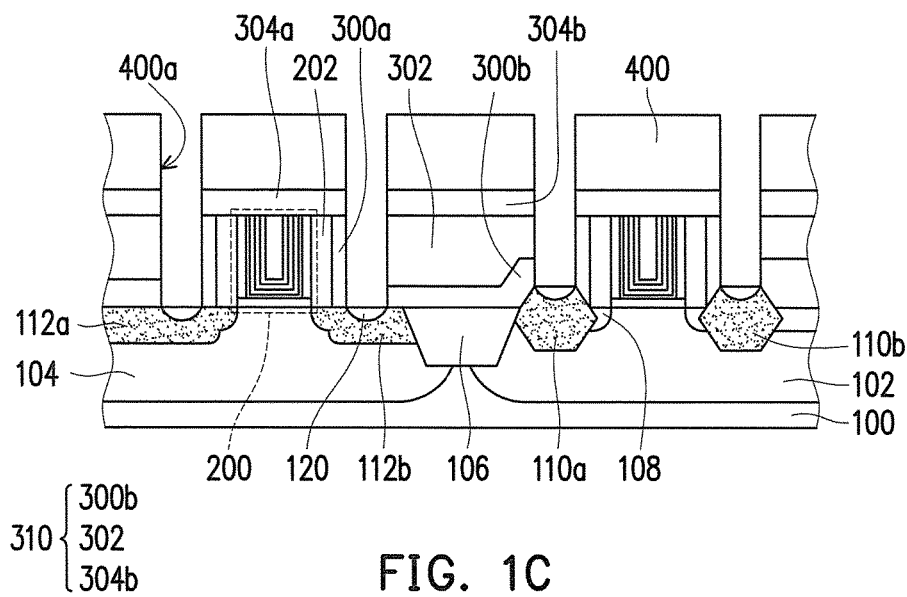

Referring to FIG. 1C, in some embodiments, through the pattern of the photoresist layer 400, the second stop material layer 304, the interlayer dielectric layer 302, and the first stop material layer 300 are patterned to render a plurality of through openings 400a penetrating through these layers. Each of the through openings 400a exposes the respective source/drain regions 110a, 110b, 112a, 112b Optionally, the exposed portion of the source/drain regions 110a, 110b, 112a, 112b may be further doped to form the doped regions 120. The doped regions 120 serve the function of enhancing the contact between the source/drain regions 110a, 110b, 112a, 112b and the subsequently formed conductive contacts. In some embodiments, the doped regions 120 may be considered as part of the source/drain regions 110a, 110b, 112a, 112b. The second stop material layer 304, the interlayer dielectric layer 302, and the first stop material layer 300 may be patterned through a photolithography process and an etching process, for example. Upon performing patterning process, the second stop material layer 304 form a first stop layers 304a and a fourth stop layer 304b. Therefore, the first stop layer 304a and the fourth stop layer 304b are made from the same layer and made of the same material. Similarly, upon patterning, the first stop material layer 300 form a second stop layer 300a and a third stop layer 300b. Thus, the second stop layer 300a and the third stop layer 300b are made from the same layer and made of the same material. Namely, the first stop layer 304a, the second stop layer 300a, the third stop layer 300b, and the fourth stop layer 304b may include high-k dielectric materials. The first layer 304a and the second stop layer 300a are separated from the third stop layer 300b and the fourth stop layer 304b by the through openings 400a. The first stop layer 304a covers the gate structures 200, the spacers 202, and the second stop layer 300a. The second stop layer 300a is located aside of the spacers 202 such that the spacers are sandwiched between the second stop layer 300a and the sidewalls of the gate structures 200. The patterned interlayer dielectric layer 302 is sandwiched between the third stop layer 300b and the fourth stop layer 304b. Moreover, since both of the first stop layer 304a and the fourth stop layer 304a are formed from the second stop material layer 304, the fourth stop layer 304a is located on the same level height as that of the first stop layer 304a. The third stop layer 300b, the patterned interlayer dielectric layer 302, and the fourth stop layer 304b may be collectively referred as a dielectric stack 310.

Figure 1D:
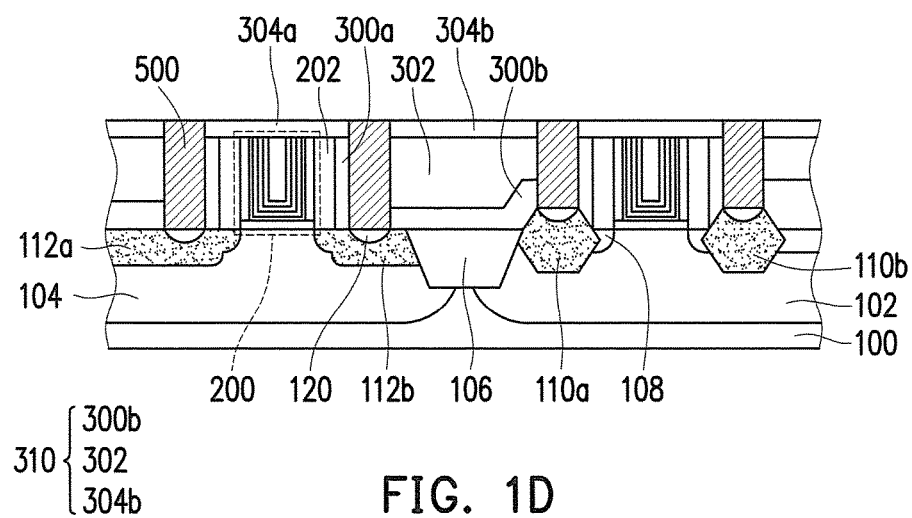

Referring to FIG. 1D, in some embodiments, after the remained photoresist layer 400 is removed, a contact conductive material (not illustrated) is filled into the through openings 400a and the extra contact conductive material is subsequently removed through CMP to form a plurality of source/drain contacts 500. During the formation of the source/drain contacts 500, the extra contact conductive material is polished and during the same process, at least a portion of the first stop layer 304a and at least a portion of the fourth stop layer 304b are also removed or grinded. As a result, a thickness of the first stop layer 304a and a thickness of the fourth stop layer 304b may be reduced. Specifically, the thickness of the grinded first stop layer 304a and the grinded fourth stop layer 304a may range from 15 nm to 35 nm. Moreover, since the fourth stop layer 304b, the first stop layer 304a, and the source/drain contacts 500 are polished simultaneously, a top surface of the fourth stop layer 304b is coplanar with a top surface of the first stop layer 304a and a top surface of the source/drain contacts 500. The source/drain contacts 500 are in contact with and are electrically connected to the corresponding source/drain regions 110a, 110b, 112a, 112b. The source/drain contacts 500 includes conductive materials. For example, the source/drain contacts 500 may include metallic materials having excellent conductivity such as copper, tungsten, cobalt, the alloys thereof or combinations thereof. Referring to FIG. 1D, in some embodiments, each of the gate structures 200 is sandwiched between two adjacent source/drain contacts 500. The second stop layer 300a is located between the gate structures 200 and the source/drain contacts 500 immediately adjacent thereto. The dielectric stack 310 (the third stop layer 300b, the patterned interlayer dielectric layer 302, and the fourth stop layer 304b) is located between two most adjacent gate structures 200 and between two adjacent source/drain contacts 500 between the two most adjacent gate structures 200.

Figure 1E:
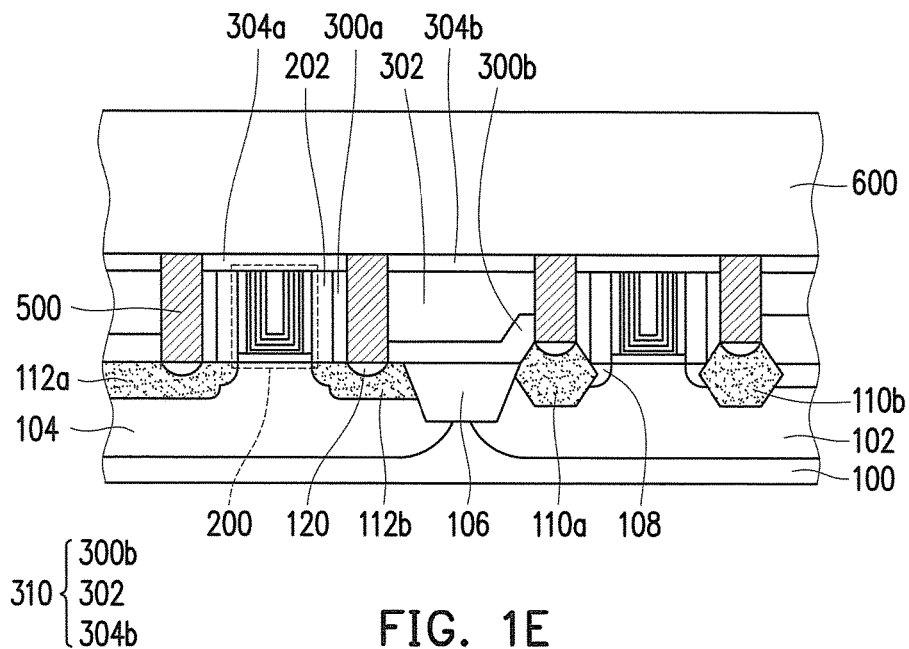

Referring to FIG. 1E, in some embodiments, a dielectric layer 600 is formed over the dielectric stack(s) 310, the source/drain contacts 500, and the first stop layer 304a. The material and the formation method of the dielectric layer 600 may be similar to those of the interlayer dielectric layer 302, so the detailed descriptions are omitted herein.

Figure 1F:
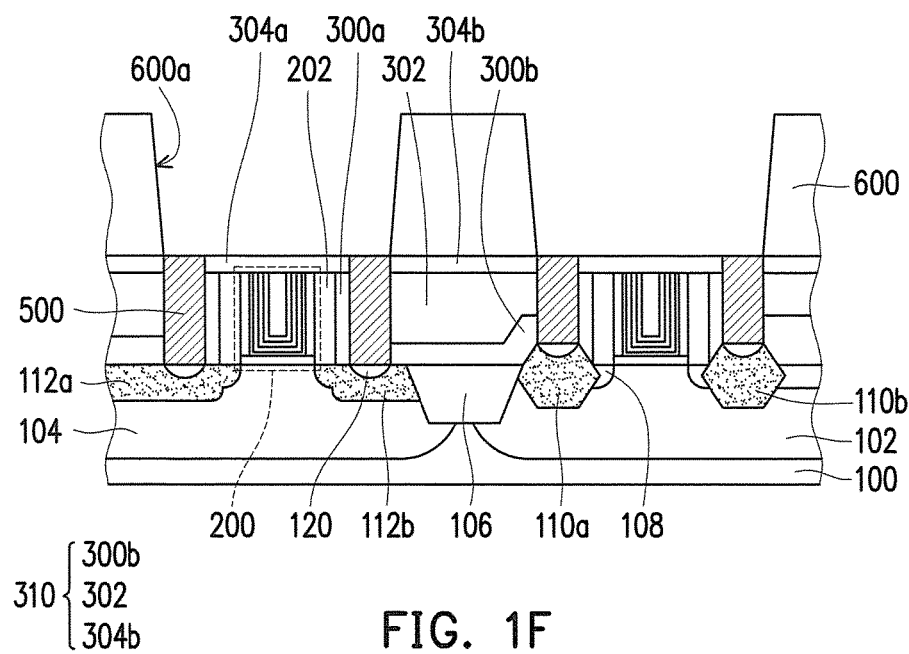

Referring to FIG. 1F, in some embodiments, the dielectric layer 600 is patterned to form a plurality of openings 600a. Each of the openings 600a exposes at least two adjacent source/drain contacts 500 on opposite sides of the gate structure 200. Each of the openings 600a also exposes the first stop layer 304a over the gate structure 200. The dielectric layer 600 may be patterned through a photolithography process and an etching process.

Figure 1G:
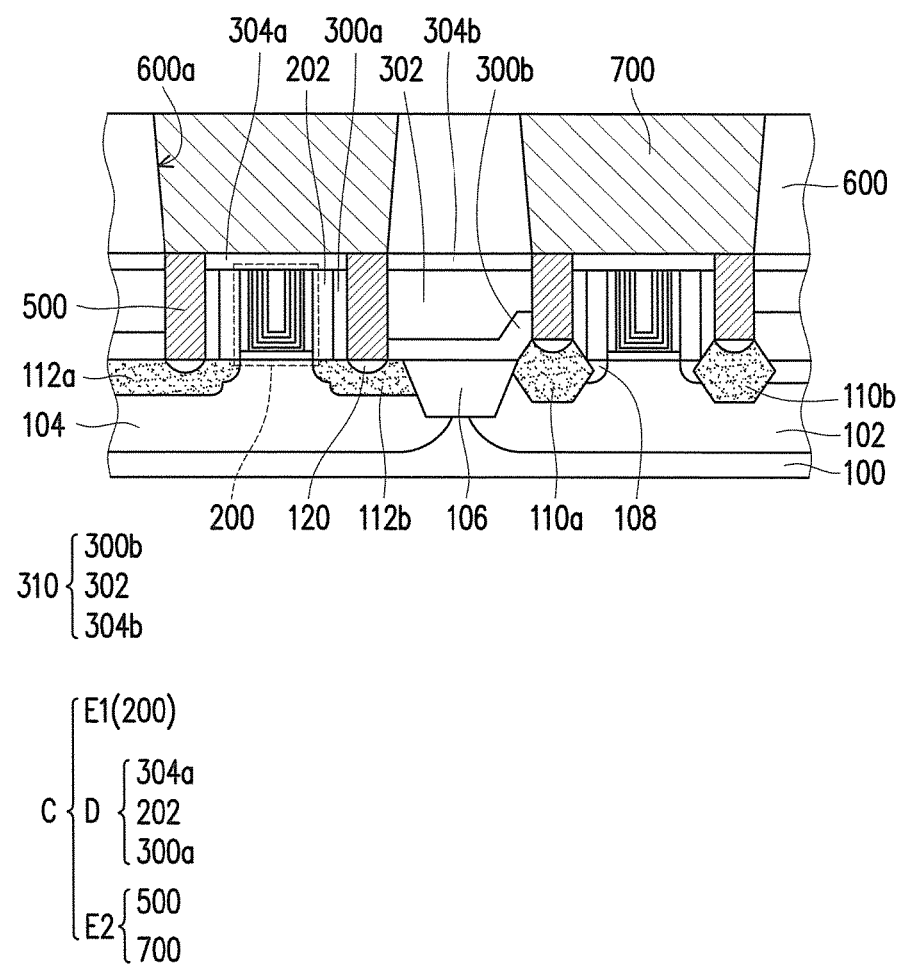

Referring to FIG. 1G, in some embodiments, a conductive material (not illustrated) is filled into the openings 600a to form a plurality of conductive elements 700 over the gate structures 200 and on the source/drain contacts 500. Since the conductive elements 700 are in contact with at least two adjacent source/drain contacts 500, the conductive elements 700 may serve as a contact layer for jointly connecting more than one of the source/drain regions 110a, 110b, 112a, 112b in some embodiments. As illustrated in FIG. 1G, the first stop layer 304a is sandwiched between the gate structures 200 and the conductive elements 700 to electrically insulate the gate structures 200 and the conductive elements 700.

Referring to FIG. 1G again, in some embodiments, the two adjacent source/drain contacts 500 on opposite sides of the gate structure 200 and the conductive element 700 bridging these two source/drain contacts 500 form an upside down U-shaped conductive structure. Also, in certain embodiments, the spacers 202, the second stop layers 300a aside of the gate structure 200 and the first stop layer 304a covering the gate structure 200 form an upside down U-shaped dielectric structure. The upside down U-shaped dielectric structure is sandwiched between the gate structure 200 and the upside down U-shaped conductive structure to form a capacitor C. In other words, in some embodiments, the gate structure 200 constitutes a first electrode E1 of the capacitor C, the upside down U-shaped dielectric structure constitutes a dielectric layer D of the capacitor C, and the upside down U-shaped conductive structure constitutes a second electrode E2 of the capacitor C. Since the second electrode E2 covers a portion of sidewalls and a portion of top surface of the first electrode E1, a high capacitance in the small area (i.e. higher unit capacitance) may be achieved. In other words, as the capacitor C is formed around the gate structure 200 both horizontally and vertically as a tube capacitor, charges stored in the capacitor C may be increased. Therefore, the performance of the semiconductor device may be enhanced.

As described previously in some embodiments, the capacitor(s) C is fabricated following the processes compatible with CMOS manufacturing processes and no extra mask pattern or extra etching process is required. Hence, the semiconductor device formed with three-dimensional capacitor(s) or tube capacitor(s) can afford better electrical properties without performing additional process steps.

It should be noted that the foregoing explanation focuses on the core (active) region of a semiconductor device. However, it construes no limitation in the disclosure. The foregoing structure of conductive elements 700 may also be manufactured in the peripheral region or passive regions to form capacitors with high capacitance.

Figure 2:
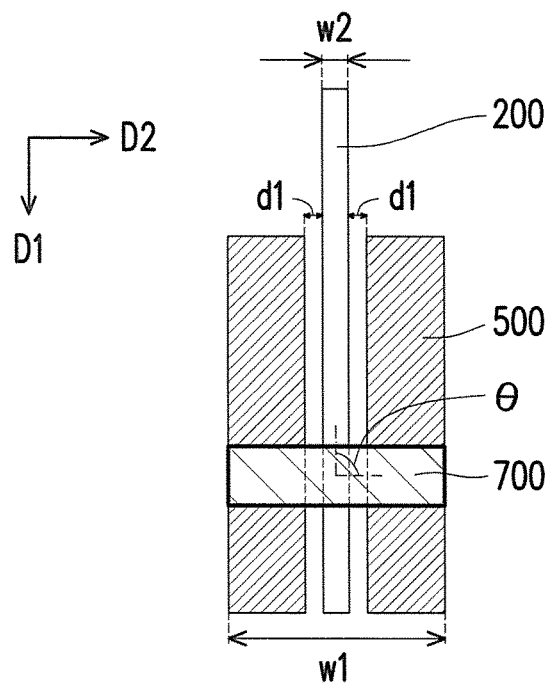
FIG. 2 is a top view of a semiconductor device in accordance with some embodiments of the disclosure.

FIG. 2 is a top view of a semiconductor device in accordance with some embodiments of the disclosure. For simplicity, FIG. 2 merely illustrated one gate structure 200 and two source/drain contacts 500 most adjacent thereto. However, it should be understood that a semiconductor device may include multiple repeating units of the structure illustrated in FIG. 2. Referring to FIG. 2 and FIG. 1G simultaneously, in some embodiments, the gate structure 200 (in a strip-shape from the top view in FIG. 2) extends along a first direction D1. Similarly, the source/drain contacts 500 that may function as a common contact and are formed as parallel strips from the top view in FIG. 2 also extend along the first direction D1. On the other hand, the conductive element 700 extends along a second direction D2 perpendicular to the first direction D1. That is, the first direction D1 and the second direction D2 form an included angle θ, and the included angle θ is equal to 90°. As illustrated in FIG. 2, in some embodiments, the extending direction (D1) of the gate structure 200 is perpendicular to the extending direction (D2) of the conductive element 700. However, the disclosure is not limited thereto. In some alternative embodiments, the extending directions of the gate structure 200 and the conductive element 700 are not required to be perpendicular with each other as long as the extending directions of these elements are not parallel with each other. For example, the included angle θ formed by the first direction D1 and the second direction D2 may range between 30° and 150°, and preferably ranges between 45° and 135°. Since the first direction D1 is not parallel to the second direction D2, the conductive element 700 crosses over (directly overlaying) a portion of the gate structure 200. On the other hand, the conductive element 700 also respectively overlaps with a portion of the source/drain contacts 500 on two opposite sides of the gate structure 200 to bridge these two adjacent source/drain contacts 500. In some embodiments, the gate structure 200 has a maximum width w2 along a direction perpendicular to the extending direction D1 thereof. On the other hand, the conductive element 700 that is formed in a strip-like shape (from top view in FIG. 2) has an overlapping width w1 along the extending direction D2 thereof. As illustrated in FIG. 2, the conductive element 700 with the overlapping width w1 crosses over the gate structure 200 and overlaps with the source/drain contacts 500. In order for the conductive element 700 to bridge the two adjacent source/drain contacts 500, the overlapping width w1 of the conductive element 700 has to be greater than the sum of distances d1 between the gate structure 200 and the two source/drain contacts 500 and the maximum width w2 of the gate structure 200. In some embodiments, depending on the layout design, the locations of the conductive element(s) 700 may be arranged in either the core region(s) or the peripheral region(s) and the conductive element(s) 700 may be formed in the spare area over the gate structures 200 and/or the source/drain contacts 500.

Figure 3:
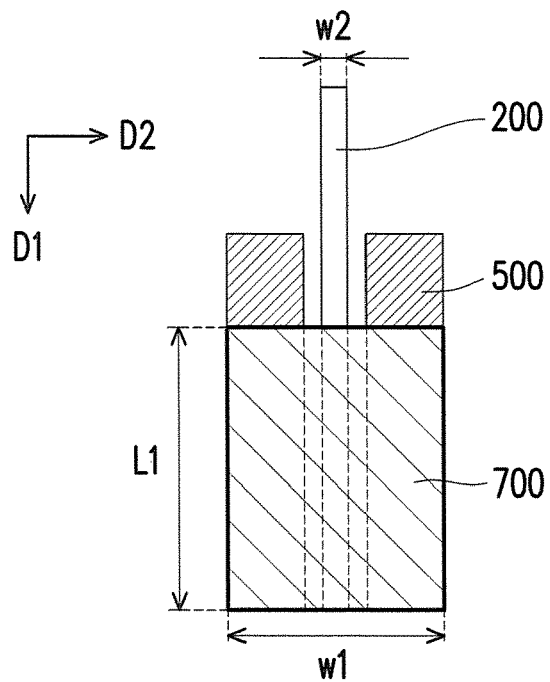
FIG. 3 is a top view of a semiconductor device in accordance with some alternative embodiments of the disclosure.

FIG. 3 is a top view of a semiconductor device in accordance with some alternative embodiments of the disclosure. The structure illustrated in FIG. 3 is similar to the structure presented in FIGS. 1A-1G and FIG. 2, so the detailed descriptions are omitted herein. As illustrated in FIG. 2, in some embodiments, the conductive element 700 takes the form of a strip-like shape. However, the disclosure is not limited thereto. In some embodiments, the extending length L1 along the direction D1 or the top view area of the conductive element 700 may be increased and the conductive element 700 takes the form of a block-like shape, as illustrated in FIG. 3. By increasing the overlapping area between the conductive element 700 and the gate structure 200, the capacitance stored in the capacitor may be further increased, thereby enhancing the performance of the semiconductor device.

Figure 4:
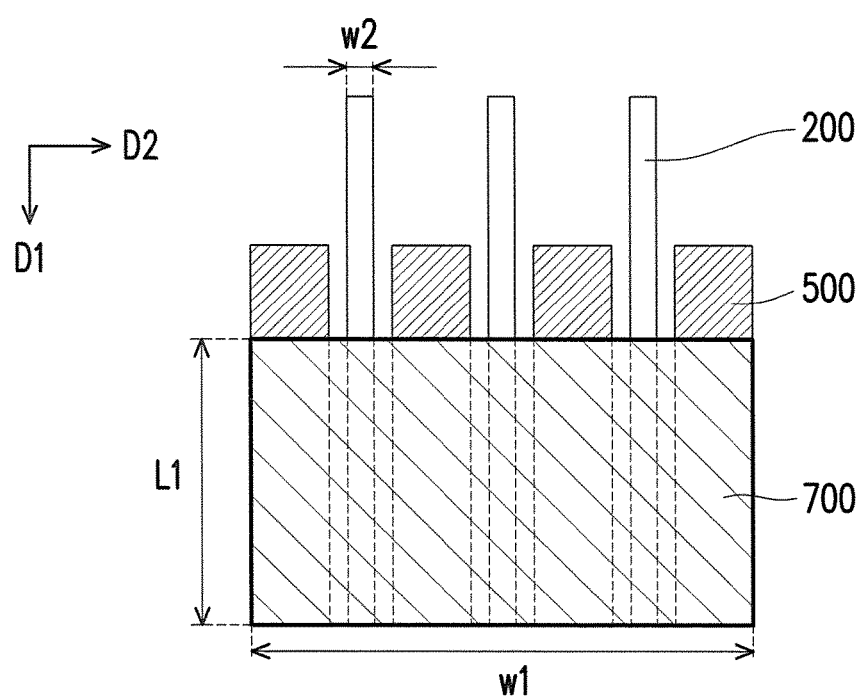
FIG. 4 is a top view of a semiconductor device in accordance with some alternative embodiments of the disclosure.

FIG. 4 is a top view of a semiconductor device in accordance with some alternative embodiments of the disclosure. The structure illustrated in FIG. 4 is similar to the structure presented in FIGS. 1A-1G and FIG. 2, so the detailed descriptions are omitted herein. As illustrated in FIG. 2, in some embodiments, the conductive element 700 crosses over one gate structure 200 and bridges two source/drain contacts 500. However, the disclosure is not limited thereto. As illustrated in FIG. 4, in some embodiments, the overlapping width w1 along the direction D2 or the top view area of the conductive element 700 is further increased and the block-shaped conductive element 700 crosses over and overlaps with three gate structures 200 and the adjacent source/drain contacts 500. Based on the design requirements, the conductive element 700 may overlap with more than one gate structure 200 and more than two source/drain contacts 500 in one single block. The configuration illustrated in FIG. 4 may increase the overlapping area between the conductive element 700 and the gate structure 200. Therefore, the capacitance stored in the capacitor may be further increased, thereby enhancing the performance of the semiconductor device.

In accordance with some embodiments of the present disclosure, a semiconductor device includes a substrate, source/drain contacts, gate structures, one or more conductive elements, and a first stop layer. The substrate has source/drain regions formed therein. The source/drain contacts are disposed over the substrate and each of the source/drain contacts is electrically connected to the respective source/drain region. The gate structures are on the substrate. The gate structures are arranged in parallel. The source/drain regions are arranged at opposite sides of the gate structures. The source/drain contacts are disposed on the corresponding source/drain regions and are arranged at the opposite sides of the gate structures. Each of the gate structures is sandwiched between two most adjacent source/drain contacts at the opposite sides of each of the gate structures. The conductive element is disposed on the source/drain contacts and crosses over the gate structures. The conductive element is overlapped with at least one gate structure and at least two most adjacent source/drain contacts at opposite sides of the at least one gate structures and is electrically connected to the at least two most adjacent source/drain contacts at opposite sides of the at least one gate structure. The first stop layer is located between the gate structures and the conductive elements to electrically insulate the gate structures from the conductive elements.

In accordance with some alternative embodiments of the present disclosure, a semiconductor device includes a substrate, a plurality of source/drain contacts, a plurality of gate structures, a plurality of spacers, a first stop layer, a second stop layer, and a plurality of conductive elements. The substrate has a plurality of source/drain regions formed therein. The source/drain contacts are over the substrate. Each of the source/drain contacts is electrically connected to the respective source/drain region. The gate structures are over the substrate. Two source/drain contacts are arranged at opposite sides of each of the gate structures. Each of the gate structures and the two immediately adjacent source/drain contacts are arranged in parallel, and each of the gate structures extends along a first direction. The spacers are disposed aside of the gate structures. The first stop layer covers the gate structures and the spacers. The second stop layer is located between the gate structures and the source/drain contacts immediately adjacent thereto. The conductive elements directly overlies a portion of the gate structures, a portion of the first stop layer, and a portion of the source/drain contacts. Each of the conductive elements is in contact with at least two of the source/drain contacts and extends along a second direction, and the first direction and the second direction form an included angle ranges between 30° and 150°.

In accordance with some embodiments of the present disclosure, a method of manufacturing a semiconductor device includes at least the following steps. A substrate having a plurality of source/drain regions formed therein is provided. A plurality of gate structures, a plurality of source/drain contacts, a plurality of dielectric stacks, and a plurality of first stop layer are formed over the substrate. The source/drain contacts are in contact with the source/drain regions and are sandwiched between the gate structures and the dielectric stacks, and the first stop layer covers the gate structures. A dielectric layer is formed over the dielectric stack, the source/drain contacts, and the first stop layer. The dielectric layer is patterned to form a plurality of openings. Each of the openings exposes at least two adjacent source/drain contacts on opposite sides of the gate structure and the first stop layer over the gate structure. A conductive material is filled into the openings to form a plurality of conductive elements bridging at least two adjacent source/drain contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising: a substrate having source/drain regions formed therein; source/drain contacts disposed completely above the source/drain regions without penetrating through the source/drain regions, wherein each of the source/drain contacts is electrically connected to the respective source/drain region; gate structures on the substrate, wherein the gate structures are arranged in parallel, the source/drain regions are arranged at opposite sides of the gate structures, the source/drain contacts are disposed on the corresponding source/drain regions and are arranged at the opposite sides of the gate structures, and each of the gate structures is sandwiched between two most adjacent source/drain contacts at the opposite sides of each of the gate structures; one or more conductive elements disposed on the source/drain contacts and crossing over the gate structures, wherein the conductive element is overlapped with at least one gate structure and at least two most adjacent source/drain contacts at opposite sides of the at least one gate structure and is electrically connected to the at least two most adjacent source/drain contacts at opposite sides of the at least one gate structure; a first stop layer located between the gate structures and the conductive elements to electrically insulate the gate structures from the conductive elements; a second stop layer located between each of the gate structures and each of the source/drain contacts; a third stop layer, an interlayer dielectric layer, and a fourth stop layer located between two adjacent gate structures, wherein the third stop layer, the interlayer dielectric layer, and the fourth stop layer are disposed over the substrate in sequential order, and the fourth stop layer is located on a same level height as that of the first stop layer.

2. The semiconductor device according to claim 1, wherein an overlapping width of the conductive elements is larger than a sum of distances between the at least one gate structure and the at least two most adjacent source/drain contacts and a maximum width of the at least one gate structure.

3. The semiconductor device according to claim 1, wherein the first stop layer comprises a high-k dielectric material.

4. The semiconductor device according to claim 1, wherein an extending direction of the gate structures is perpendicular to an extending direction of the conductive elements.

5. The semiconductor device according to claim 1, wherein an extending direction of the gate structures and an extending direction of the conductive elements form an included angle ranges between 45° and 135°.

6. A semiconductor device, comprising: a substrate having a plurality of source/drain regions formed therein; a plurality of source/drain contacts over the substrate, wherein each of the source/drain contacts is electrically connected to the respective source/drain region; a plurality of gate structures over the substrate, wherein two source/drain contacts are arranged at opposite sides of each of the gate structures, each of the gate structures and the two immediately adjacent source/drain contacts are arranged in parallel, each of the gate structures extends along a first direction, and each of the gate structures comprises a gate dielectric layer; a plurality of spacers aside of the gate structures; a first stop layer covering the gate structures and the spacers; a second stop layer located between the gate structures and the source/drain contacts immediately adjacent thereto, wherein the second stop layer is laterally separated from the gate dielectric layer without directly contacting the gate dielectric layer; a third stop layer, an interlayer dielectric layer, and a fourth stop layer located between two adjacent gate structures, wherein the third stop layer, the interlayer dielectric layer, and the fourth stop layer are disposed over the substrate in sequential order, wherein the fourth stop layer and the first stop layer are made of the same material; and a plurality of conductive elements directly overlaying a portion of the gate structures, a portion of the first stop layer, and a portion of the source/drain contacts, wherein each of the conductive elements is in contact with at least two of the source/drain contacts and extends along a second direction, and the first direction and the second direction form an included angle ranges between 30° and 150°.

7. The semiconductor device according to claim 6, wherein the semiconductor device comprises one or more capacitors, and each capacitor comprises a first electrode, a second electrode, and a dielectric layer located between the first electrode and the second electrode, and wherein the gate structures form the first electrode, the source/drain contacts and the conductive elements form the second electrode.

8. The semiconductor device according to claim 7, wherein the spacers, the first stop layer, and the second stop layer form the dielectric layer of the capacitor.

9. The semiconductor device according to claim 6, wherein at least one of the first stop layer and the second stop layer comprises a high-k dielectric material.

10. The semiconductor device according to claim 6, wherein at least one of the conductive elements crosses over at least one gate structure and bridges two source/drain contacts immediately adjacent the at least one gate structure.

11. The semiconductor device according to claim 10, wherein an overlapping width of each of the conductive elements is larger than a maximum width of each of the gate structures.

12. A method of manufacturing a semiconductor device, comprising: providing a substrate having a plurality of source/drain regions formed therein; forming a plurality of gate structures, a plurality of source/drain contacts, a plurality of dielectric stacks, and a plurality of first stop layer over the substrate, wherein the source/drain contacts are located completely above the source/drain regions without penetrating through the source/drain regions, the source/drain contacts are in contact with the source/drain regions and are sandwiched between the gate structures and the dielectric stacks, and the first stop layer covers the gate structures; forming a dielectric layer over the dielectric stack, the source/drain contacts, and the first stop layer; patterning the dielectric layer to form a plurality of openings, wherein each of the openings exposes at least two adjacent source/drain contacts on opposite sides of the gate structure and the first stop layer over the gate structure; filling a conductive material into the openings, so as to form a plurality of conductive elements bridging at least two adjacent source/drain contacts; wherein the step of forming the source/drain contacts, the dielectric stacks, and the first stop layer over the substrate comprises: forming a first stop material layer and an interlayer dielectric layer aside of the gate structure, wherein the first stop material layer covers the source/drain regions, and the interlayer dielectric layer is over the first stop material layer; forming a second stop material layer over the gate structures, the first stop material layer, and the interlayer dielectric layer; patterning the second stop material layer, the interlayer dielectric layer, and the first stop material layer to form a plurality of through openings, the first stop layer, a second stop layer, a third stop layer, and a fourth stop layer, wherein the third stop layer, the patterned interlayer dielectric layer, and the fourth stop layer form the dielectric stack, and each of the through openings exposes respective source/drain region; filling a contact conductive material into the through openings, so as to form the source/drain contacts.

13. The method according to claim 12, wherein the second stop layer is sandwiched between each of the gate structures and each of the source/drain contacts.

14. The method according to claim 12, wherein the first stop layer and the fourth stop layer are formed from the same layer, and the second stop layer and the third stop layer are formed from the same layer.

15. The method according to claim 12, further comprising forming a plurality of spacers between each of the gate structures and each of the source/drain contacts.

16. The method according to claim 12, wherein the step of forming the gate structures over the substrate comprises a gate replacement process.

* * * * *